United States Patent
Meyer et al.

(10) Patent No.: US 11,519,988 B2
(45) Date of Patent: Dec. 6, 2022

(54) METHOD FOR ADJUSTING AT LEAST ONE MEASUREMENT PARAMETER FOR A MEASUREMENT PROTOCOL FOR A MAGNETIC RESONANCE EXAMINATION

(71) Applicant: Siemens Healthcare GmbH, Erlangen (DE)

(72) Inventors: Stefan Meyer, Langensendelbach (DE); Manuela Rick, Uttenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/232,815

(22) Filed: Apr. 16, 2021

(65) Prior Publication Data

US 2021/0325497 A1 Oct. 21, 2021

(30) Foreign Application Priority Data

Apr. 21, 2020 (DE) .......................... 102020205034.1

(51) Int. Cl.
  *G01V 3/00* (2006.01)
  *G01R 33/54* (2006.01)
  *G01R 33/36* (2006.01)

(52) U.S. Cl.
  CPC ....... *G01R 33/543* (2013.01); *G01R 33/3664* (2013.01)

(58) Field of Classification Search
  CPC .............. G01R 33/3415; G01R 33/543; G01R 33/5659; G01R 33/36; A61B 5/055
  (Continued)

(56) References Cited

U.S. PATENT DOCUMENTS

2003/0139944 A1  7/2003 Carlsen et al.
2008/0275333 A1* 11/2008 Fain .................... G01R 33/3415
                                              600/422
(Continued)

FOREIGN PATENT DOCUMENTS

CN            1748217 A    *  3/2006   ............. G16H 50/20
CN          203578232 U    *  5/2014

OTHER PUBLICATIONS

Keil, M.: Spulenunabhangige Protokolle; Published: Jun. 14, 2018, No. 99, and English translation.
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

The disclosure relates to techniques for adjusting at least one measurement parameter for a measurement protocol for a magnetic resonance examination. The techniques include providing at least one item of parameter information for adjusting a value of the at least one measurement parameter, wherein the at least one item of parameter information is provided independently of coil information for the magnetic resonance examination, and selecting a value of the at least one measurement parameter. The techniques further include transmitting the selected value to a protocol adjusting unit connected to the scanner unit of the magnetic resonance apparatus, providing coil information of the scanner unit, and automatically adjusting the value of the at least one measurement parameter based on the coil information provided.

17 Claims, 3 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2013/0197401 A1* | 8/2013 | Sato | A61N 7/00 601/2 |
| 2015/0253395 A1* | 9/2015 | Lazar | G01R 33/546 324/318 |
| 2018/0060486 A1 | 3/2018 | Keil | |
| 2018/0306883 A1 | 10/2018 | Meyer et al. | |
| 2020/0132790 A1 | 4/2020 | Meyer et al. | |

OTHER PUBLICATIONS

German action dated Feb. 4, 2021, Application No. 10 2020 205 034.1.

\* cited by examiner

FIG 1

Magnetic resonance apparatus

METHOD FOR ADJUSTING AT LEAST ONE MEASUREMENT PARAMETER FOR A MEASUREMENT PROTOCOL FOR A MAGNETIC RESONANCE EXAMINATION

CROSS-REFERENCE TO RELATED APPLICATIONS

The present application claims the benefit of the filing date of German patent application no. DE 10 2020 205 034.1, filed on Apr. 21, 2020, the contents of which are incorporated herein by reference in their entirety.

TECHNICAL FIELD

The disclosure relates to techniques for adjusting measurement parameters for a measurement protocol for a magnetic resonance examination. In addition, the present disclosure relates to a protocol adjusting unit with an artificial neural network. The present disclosure also relates to a magnetic resonance system with a magnetic resonance apparatus comprising a scanner unit, a selection unit, and a protocol adjusting unit for carrying out the method for adjusting at least one measurement parameter for a measurement protocol for a magnetic resonance examination.

BACKGROUND

Magnetic resonance examinations on patients are typically performed using local radio-frequency coils to acquire magnetic resonance image data with few interference signals. For this purpose, it is frequently necessary for individual values of measurement parameters of a measurement protocol for carrying out a magnetic resonance examination to be adapted to a coil configuration, with which the magnetic resonance examination is to be performed on the patient. In this context, a coil configuration comprises both the physical radio-frequency coil and the selectable coil elements of the radio-frequency coil. For example, a 32-channel radio-frequency spine coil can comprise eight selectable coil elements. Herein, both the type of radio-frequency coil and the selected coil elements are stored in the measurement protocol. In this context, individual protocol parameters and/or measurement parameters, for example, are restricted by the use of a defined and/or specific coil configuration.

In particular, a user, for example a medical operator, must take account of the coil configuration when adjusting parameters for a magnetic resonance examination. Hence, in particular for inexperienced users, for example for an inexperienced medical operator, selecting a measurement protocol and/or adjusting protocol parameters and/or measurement parameters is very time-consuming and can also lead to unwanted faulty adjustments to the protocol parameters and/or measurement parameters.

If measurement protocols are parameterized with a coil configuration for one measuring system, these measurement protocols are inconsistent with other measuring systems, in particular other coil configurations. As a result, these measurement protocols cannot be used with the other measuring systems or have to be converted before use. A separate measurement protocol is thus compiled and stored for each available coil configuration. However, this leads to an enormous effort for a user and makes it difficult to obtain a clear overview when selecting the measurement protocols.

SUMMARY

The underlying object of the present disclosure is in particular to reduce complexity for a user when adjusting measurement parameters and to increase interchangeability of measurement protocols between different magnetic resonance systems. The object is achieved by the embodiments of the disclosure as discussed herein and in the claims.

The disclosure is based on a method for adjusting at least one measurement parameter for a measurement protocol for a magnetic resonance examination comprising:

carrying out the following steps by means of a selection unit, which is separate from a scanner unit of a magnetic resonance apparatus:

providing at least one item of parameter information for adjusting a value of the at least one measurement parameter, wherein the at least one item of parameter information is provided independently of coil information for the magnetic resonance examination, and selecting a value of the at least one measurement parameter, transmitting the value of the at least one measurement parameter from the selection unit to a protocol adjusting unit, wherein the protocol adjusting unit is connected to the scanner unit of the magnetic resonance apparatus and the following steps are carried out by means of the protocol adjusting unit:

providing coil information of the scanner unit, and automatically adjusting the value of the at least one measurement parameter in dependence on the coil information provided.

A magnetic resonance examination is performed on a patient, e.g. on a region of interest of the patient, to clarify a clinical and/or medical issue. In this context, a schedule of a magnetic resonance examination describes a workflow, wherein the schedule and/or workflow may define a sequence of individual measurement protocols for carrying out the magnetic resonance examination.

A measurement protocol comprises a set of measurement parameters that are required to describe a specific manifestation of a sequence. In this context, typical measurement parameters can comprise an echo time (TE), a repetition time (TR), a field of view, a matrix size, a number of slices, a fat saturation method, an acceleration method, a local radio-frequency antenna unit, etc. Such measurement parameters of a measurement protocol are frequently also strongly dependent on the hardware available on site and/or the implementation of the magnetic resonance apparatus, such as, for example, a gradient strength of the magnetic resonance apparatus and/or a number of recording channels and/or an embodiment of a local radio-frequency coil etc. Thus, a measurement protocol describes a certain way of recording an image with a specific implementation of a magnetic resonance apparatus. For instance, a contrast and/or a geometry and a measuring duration may be matched to the clinical issue to be addressed by the upcoming magnetic resonance examination.

Hence, individual measurement parameters of the measurement protocol can be adapted by a user to the medical or clinical issue to be addressed by the magnetic resonance examination. In this context, the user, e.g. a medical operator, can select a value for the at least one measurement parameter e.g. from a permissible value space and/or from a permissible value range. The permissible value space and/or the permissible value range for a value of at least one measurement parameter may be predetermined. As an example, the permissible value space and/or the permissible value range for a value of a measurement parameter is held in the selection unit and is available for the selection of a value of a measurement parameter. Moreover, a permissible value space and/or a permissible value range for a value of at least one measurement parameter can also be system-dependent, for example a permissible value space and/or a permissible value range for a value of at least one measurement parameter can be dependent on a maximum permissible gradient strength of an implementation of a gradient coil. In this context, the provision of the at least one item of parameter information for adjusting a value of the at least one measurement parameter may comprise providing a permissible value space and/or a permissible value range for the at least one measurement parameter.

The selection unit may be implemented separate from the scanner unit. For instance, the selection unit may be implemented separate from the scanner unit with regard to data exchange and not connected to the scanner unit. The selection unit may be implemented separate from the scanner unit for providing at least one item of parameter information for adjusting the value of the at least one measurement parameter and for selecting a value of the at least one measurement parameter. The provision of the at least one item of parameter information is independent of coil information of the scanner unit. The fact that the selection unit is separate from the scanner unit of the magnetic resonance apparatus means that coil information also cannot be accessed by means of the selection unit.

Herein, the selection unit can comprise at least one computing module and/or a processor (e.g. processing circuitry). For example, the selection unit may be implemented to execute computer-readable instructions to provide at least one item of parameter information for adjusting a value of the at least one measurement parameter and controlling a selection of a value of the at least one measurement parameter. As an example, the selection unit comprises a memory unit, wherein computer-readable information is stored on the memory unit (e.g. a non-transitory computer-readable medium), wherein the selection unit is implemented to load the computer-readable information from the memory unit and execute the computer-readable information (e.g. instructions) to provide at least one item of parameter information for adjusting a value of the at least one measurement parameter and controlling a selection of a value of the at least one measurement parameter.

The components of the selection unit can be predominantly implemented in the form of software components. In principle, however, e.g. where particularly fast calculations are involved, these components can also be partially implemented in the form of software-supported hardware components, for example FPGAs or the like. Similarly, for example if only a transfer of data from other software components is involved, the required interfaces can be implemented as software interfaces. However, the required interfaces can also be implemented as hardware-based interfaces that are actuated by means of suitable software. Obviously, it is also conceivable for several of the components named to be implemented together in the form of an individual software component or a software-supported hardware component.

Moreover, in this context, the selection unit can also comprise a user interface, such as, for instance, an input unit and an output unit, by means of which a user, e.g. a medical operator, can select a value of the at least one measurement parameter. In this context, a value of the at least one measurement parameter is selected by a user, e.g. the medical operator, at the user interface of the selection unit.

Herein, the transmission of the value of the at least one measurement parameter from the selection unit to a protocol adjusting unit can take place by means of a network connection between the selection unit and the protocol adjusting unit. Moreover, the transmission of the value of the at least one measurement parameter can also take place by means of a mobile data carrier, such as, for example, a memory stick, from the selection unit to the protocol adjusting unit.

Herein, the protocol adjusting unit can comprise at least one computing module and/or processor. For example, the protocol adjusting unit may be implemented to carry out (i.e. execute) computer-readable instructions to provide coil information of the scanner unit and/or carry out an automatic adjustment of the value of the at least one measurement parameter in dependence on the coil information provided. As an example, the protocol adjusting unit comprises a memory unit, wherein computer-readable information is stored on the memory unit, wherein the protocol adjusting unit is embodied to load the computer-readable information from the memory unit and execute the computer-readable information in order to provide coil information of the scanner unit and/or carry out an automatic adjustment of the value of the at least one measurement parameter in dependence on the coil information provided.

The components of the protocol adjusting unit can be predominantly implemented in the form of software components. In principle, however, in particular where particularly fast calculations are involved, these components can also be partially implemented in the form of software-supported hardware components, for example FPGAs or the like. Similarly, for example if only a transfer of data from other software components is involved, the required interfaces can be implemented as software interfaces. However, the required interfaces can also be implemented as hardware-based interfaces that are actuated by means of suitable software. Obviously, it is also conceivable for several of the components named to be implemented together in the form of an individual software component or software-supported hardware component.

The protocol adjusting unit is connected to the scanner unit. In this context, the protocol adjusting unit is e.g. connected to the scanner unit with regard to data exchange so that in particular coil information can be exchanged between the protocol adjusting unit and the scanner unit. Moreover, herein, the protocol adjusting unit can also be comprised by the magnetic resonance apparatus and/or the scanner unit of the magnetic resonance apparatus.

The provision of coil information of the scanner unit by means of the protocol adjusting unit comprises current coil information for local radio-frequency coils that are currently connected to the scanner unit for the upcoming magnetic resonance examination. Such coil information is e.g. only made available and/or provided if a connection, e.g. a data connection, exists and/or is present between the protocol adjusting unit and the scanner unit. As an example, the connection between the protocol adjusting unit and the scanner unit is established and/or present when the measurement protocol is integrated and/or used in the workflow. To be precise, it is then adapted and/or adjusted to match the real coil environment. Moreover, the coil information provided can also comprise information as to which value range and/or which value space for the value of the at least one measurement parameter is available when using a defined and/or specific local radio-frequency coil. A coil-related value range and/or coil-related value space for the value of the at least one measurement parameter when using a defined and/or specific local radio-frequency coil and/or coil configuration can also be allocated by the protocol adjusting unit if information on the type and scope of the local radio-frequency coil and/or coil configuration is available.

The automatic adjustment of the value of the at least one measurement parameter in dependence on the coil information provided by means of the protocol adjusting unit can herein also comprise the adaptation of the selected value of the at least one measurement parameter in dependence on the coil information provided so that the value of the at least one measurement parameter is in conformity with the coil information provided.

The method according to the disclosure advantageously enables the complexity of the adjustment of measurement parameters for a user, e.g. a medical operator, to be reduced. As an example, in this context the user can select the value of the at least one measurement parameter to be adjusted independently of coil information. Furthermore, user effort when adjusting and/or selecting the value for the at least one measurement parameter of the measurement protocol is also reduced.

A further advantage is that the selection unit can be used to prepare for the magnetic resonance examination without the need in this context for a data connection to the scanner unit. As an example, this also enables a user to select the measurement parameters at any location that is independent of the location of the scanner unit. A further advantage is that a user can select measurement parameters for a plurality of scanner units with different coil configurations simultaneously in the selection unit. Hence, for example a plurality of scanner units that differ in their coil configuration but are sufficiently similar in respect of the gradient system and/or the field strength of a main magnet can be combined when selecting measurement protocols and/or when adjusting measurement parameters of measurement protocols.

Moreover, this advantageously enables measurement protocols to be exchanged between different magnetic resonance systems. A further advantage is that the effort for the maintenance and/or care of different measurement protocols is reduced since in principle the number of protocols can be reduced. Also, it is not necessary to take account of coil information when converting measurement protocols, which simplifies the process of converting measurement protocols.

In one advantageous development of the method according to an embodiment of the disclosure, it can be provided that the automatic adjustment of the value of the at least one measurement parameter in dependence on the coil information provided comprises the direct adjustment of the selected value of the at least one measurement parameter, provided that the selected value of the at least one measurement parameter is in conformity with the coil information provided. Conformity of the coil information provided with the at least one selected value of the at least one measurement parameter may comprise that a permissible value range and/or a permissible value space for the at least one measurement parameter is prespecified (e.g. predetermined) for the local radio-frequency coil and the selected value of the at least one measurement parameter lies within this permissible value range and/or a permissible value space. The local radio-frequency coil and thus also coil information can, for example, be acquired on the basis of information by a coil plug contact of the local radio-frequency coil with the scanner unit. As an example, the coil information provided can be checked before adjusting the value of the at least one measurement parameter in dependence on the coil information provided. In this context, the protocol adjusting unit automatically compares the permissible value range and/or permissible value space for the at least one measurement parameter for the corresponding local radio-frequency coil with the selected value of the at least one measurement parameter.

Such an embodiment of the disclosure enables the value of the at least one measurement parameter to be adjusted and/or adapted quickly in dependence on the coil parameter provided. Moreover, manual errors during the adjustment can be reduced and/or prevented in this way.

In one advantageous development of the method according to an embodiment of the disclosure, it can be provided that the automatic adjustment of the value of the at least one measurement parameter in dependence on the coil information provided comprises an automatic determination of an adapted value of the at least one measurement parameter in dependence on the coil information provided, provided that the selected value of the at least one measurement parameter is not in conformity with the coil information provided. If the coil information provided comprises a local radio-frequency coil that specifies a permissible value range and/or a permissible value space for the at least one measurement parameter, wherein the permissible value range and/or the permissible value space does not comprise the selected value of the at least one measurement parameter, there is accordingly no conformity between the coil information provided and the selected value of the at least one measurement parameter. In such a case, the protocol adjusting unit automatically adapts the selected value of the at least one measurement parameter until the adapted value of the at least one measurement parameter is in conformity with the permissible value range and/or the permissible value space of the local radio-frequency coil for the at least one measurement parameter.

This embodiment of the disclosure has the advantage that a quick adaptation of the value of the at least one measurement parameter to the coil information provided is achieved. As a result, it is advantageously possible to dispense with time-consuming manual adaptation and manual errors during manual adaptation are also prevented.

In one advantageous development of the method according to an embodiment of the disclosure, it can be provided that after an automatic adaptation of the value of the at least one measurement parameter, output information is generated and output. In this context, the output information is generated automatically by the protocol adjusting unit, e.g. the output information is generated in terms of time after the adaptation of the value of the at least one measurement parameter. In addition, the output information is e.g. generated before the magnetic resonance examination on the patient is carried out. The output information may be output by means of a user interface, e.g. an output unit of the user interface, to a user, e.g. to a medical operator. The output information may be output to the user before the magnetic resonance examination is carried out. Herein, the protocol adjusting unit can comprise the user interface. Moreover, it is also conceivable for the user interface to be comprised by the magnetic resonance apparatus and for the output information to be transmitted from the protocol adjusting unit to the user interface of the magnetic resonance apparatus in order to be output. The output information advantageously comprises information on the value to which the at least one measurement parameter is automatically adapted by the protocol adjusting unit on the basis of the coil information provided. This can result in information advantageously being output to the user.

In one advantageous development of the method according to an embodiment of the disclosure, it can be provided that the protocol adjusting unit has artificial intelligence, wherein the artificial intelligence is implemented to perform the automatic adjustment of the value of the at least one measurement parameter. The artificial intelligence of the protocol adjusting unit may be implemented to perform the automatic adaptation of the value of the at least one measurement parameter in dependence on the coil information provided until the value of the at least one measurement parameter is in conformity with the coil information provided.

The artificial intelligence of the protocol adjusting unit may be implemented based on any suitable machine learning method. In this way, the automatic adjustment of the value of the at least one measurement parameter in dependence on coil information provided is based on a machine learning method, which may also be called a deep-learning method, which is based on the artificial neural network. An artificial neural network (ANN) may be implemented as a network of artificial neurons that is simulated in a computer program. Herein, the artificial neural network is typically based on a networking of a plurality of artificial neurons. Herein, the artificial neurons are typically arranged on different layers.

The artificial neural network usually comprises an input layer and an output layer, the neuron output of which is the only one visible in the artificial neural network. Layers between the input layer and the output layer are typically designated hidden layers.

Typically, first an architecture and/or topology of an artificial neural network is initiated and then trained in a training phase for a special task or for a plurality of tasks in a training phase. Herein, the training of the artificial neural network typically comprises a change to a weighting of a connection between two artificial neurons of the artificial neural network. The training of the artificial neural network can also comprise the development of new connections between artificial neurons, the deletion of existing connections between artificial neurons, the adaptation of threshold values for artificial neurons, and/or the addition or deletion of artificial neurons. The artificial neural network may for example already been suitably trained to adjust the value of the at least one measurement parameter automatically. Herein, for the training of the artificial neural network, e.g. training datasets have been used in which, for example, a value of a measurement parameter has already been allocated to the coil information provided. In this context, the artificial neural network may be e.g. trained for all adjustable measurement parameters.

This embodiment of the disclosure has the advantage that a particularly quick and efficient adjustment, e.g. a particularly quick and efficient adaptation of the value of the at least one measurement parameter to the coil information provided takes place. As an example, in this way, a dynamic adaptation of the protocol adjusting unit to a changed coil configuration and/or to changed parameter properties of a local radio-frequency coil can also be achieved quickly and easily, thus considerably reducing manual effort.

In one advantageous development of the method according to an embodiment of the disclosure, it can be provided that on the basis of the selected value of the at least one measurement parameter, the protocol adjusting unit automatically selects a local radio-frequency coil in dependence on the coil information provided. If, for example, two or more local radio-frequency coils are plugged in for the upcoming magnetic resonance examination so that coil information is provided for two or more local radio-frequency coils and/or is available in the protocol adjusting unit, the protocol adjusting unit can automatically select the best coil configuration from the coil information provided in dependence on the selected value of the at least one measurement parameter. Moreover, it may also be the case that one radio-frequency coil or a plurality of radio-frequency coils comprise a plurality of, e.g. two or more adjustable coil configurations. In such a case, the protocol adjusting unit also automatically selects the corresponding and/or best coil configuration, e.g. the corresponding coil elements of a local radio-frequency coil in dependence on the selected value of the at least one measurement protocol. For example, in the case of a local radio-frequency coil comprising a 32-channel radio-frequency spine coil with eight selectable coil elements, the protocol adjusting unit can automatically select the corresponding coil elements and thus the best coil configuration of the 32-channel radio-frequency spine coil for the selected value of the at least one measurement parameter.

Such an embodiment of the disclosure has the advantage that there is always optimal utilization of the existing radio-frequency coils and/or an existing coil configuration for a magnetic resonance examination. Moreover, it is also possible to achieve a quick and error-free selection of a coil configuration in dependence on the selected value of the at least one measurement parameter.

In addition, the disclosure is based on a protocol adjusting unit with an artificial neural network, wherein the artificial neural network is implemented to adjust the value of the at least one measurement parameter automatically in dependence on the coil information provided. This enables a particularly quick and efficient adjustment, e.g. a particularly quick and efficient adaptation of the value of the at least one measurement parameter to the coil information provided. As an example, this also enables a dynamic adaptation of the protocol adjusting unit to a changed coil configuration and/or to changed parameter properties of a local radio-frequency coil to be achieved.

In addition, the disclosure is based on a magnetic resonance system with a magnetic resonance apparatus comprising a scanner unit for acquiring magnetic resonance image data, a selection unit, and a protocol adjusting unit, wherein the magnetic resonance system is provided and/or implemented to carry out a method for adjusting at least one measurement parameter for a measurement protocol for a magnetic resonance examination.

The magnetic resonance system comprises the magnetic resonance apparatus with the scanner unit. The magnetic resonance apparatus may comprise a medical and/or diagnostic magnetic resonance apparatus configured and/or implemented to acquire medical and/or diagnostic image data and to clarify medical and/or clinical issues. The scanner unit of the magnetic resonance apparatus may comprise a detector unit, e.g. a magnet unit, for acquiring medical and/or diagnostic image data. In this context, the scanner unit, e.g. the magnet unit, may comprise a main magnet, a gradient coil unit, and a radio-frequency antenna unit, wherein the radio-frequency antenna unit is arranged permanently within the scanner unit, e.g. the magnet unit.

The scanner unit of the magnetic resonance apparatus at least partially surrounds a patient receiving area of the magnetic resonance apparatus. For example, the patient receiving area may be implemented as cylindrical and/or surrounded by the scanner unit in a cylindrical shape. A field of view (FOV) and/or an isocenter of the magnetic resonance apparatus may be arranged within the patient receiving area. The FOV may comprise an acquisition region of the magnetic resonance apparatus within which ideal conditions exist for the acquisition of medical image data within the patient receiving area.

The isocenter of the magnetic resonance apparatus may comprise the region and/or point within the magnetic resonance apparatus with the most optimal and/or ideal conditions for the acquisition of medical image data. For example, the isocenter comprises the most homogeneous magnetic field region within the magnetic resonance apparatus. For a magnetic resonance examination, the patient, e.g. the region of interest of the patient, is arranged and/or positioned within the patient receiving area. For this purpose, the patient is first positioned on the patient table. The patient table is then moved into the patient receiving area together with the patient positioned on the patient table until the region of interest of the patient is arranged in the FOV and/or the isocenter of the magnetic resonance apparatus, e.g. the scanner unit.

The protocol adjusting unit can be comprised by the scanner unit and/or the magnetic resonance apparatus. Moreover, the protocol adjusting unit can also comprise a unit separate from the magnetic resonance apparatus which is connected to the magnetic resonance apparatus, e.g. the scanner unit, by means of a network and/or a data exchange unit. In addition, the selection unit comprises a unit separate from the magnetic resonance apparatus, e.g. the scanner unit of the magnetic resonance apparatus, wherein no data exchange takes place between the selection unit and the scanner unit. Moreover, the selection unit and the protocol adjusting unit can also be implemented as a common unit, wherein, for the steps of the provision of at least one item of parameter information for the adjustment of a value of the at least one measurement parameter and the selection of a value of the at least one measurement parameter, the common unit is not connected to the scanner unit. On the other hand, the common unit is connected to the scanner unit for the steps of the provision of coil information of the scanner unit and the automatic adjustment of the value of the at least one measurement parameter in dependence on the coil information provided.

The magnetic resonance system according to the disclosure can advantageously enable the complexity of the adjustment of measurement parameters for a user, e.g. a medical operator, to be reduced. As an example, in this context the user can select the value of the at least one measurement parameter to be adjusted independently of coil information. Furthermore, user effort is also reduced during the adjustment and/or selection of the value for the at least one measurement parameter of the measurement protocol.

A further advantage is that the selection unit can be used to prepare for the magnetic resonance examination without the need in this context for a data connection to the scanner unit. For instance, this also enables a user to select the measurement parameters at any location that is independent of the location of the scanner unit. A further advantage consists in the fact that the user can select measurement parameters for a plurality of scanner units with different coil configurations simultaneously in the selection unit. Hence, for example, a plurality of scanner units that differ in their coil configuration but are sufficiently similar in respect of the gradient system and/or the field strength of a main magnet can be combined when selecting measurement protocols and/or when adjusting measurement parameters of measurement protocols.

Moreover, this advantageously enables measurement protocols to be exchanged between different magnetic resonance systems. A further advantage is that the effort for the maintenance and/or care of different measurement protocols is reduced since, in principle, the number of protocols can be reduced. Also, it is not necessary to take account of coil information when converting measurement protocols, which simplifies the process of converting measurement protocols.

The advantages of the magnetic resonance system embodiments according to the disclosure substantially correspond to the advantages of the method embodiments according to the disclosure for the adjustment of at least one measurement parameter for a measurement protocol for a magnetic resonance examination, which were explained in detail above. Features, advantages or alternative embodiments mentioned in this context can also be transferred to the other claimed subject matter, and vice versa.

BRIEF DESCRIPTION OF THE DRAWINGS/FIGURES

Further advantages, features and details of the disclosure may be derived from the exemplary embodiment described below and with reference to the drawings.

Example embodiments of the present disclosure are described in detail below with reference to the accompanying drawings to give those skilled in the art a clearer understanding of the abovementioned and other features and advantages of the present disclosure.

DETAILED DESCRIPTION

Figure 1:
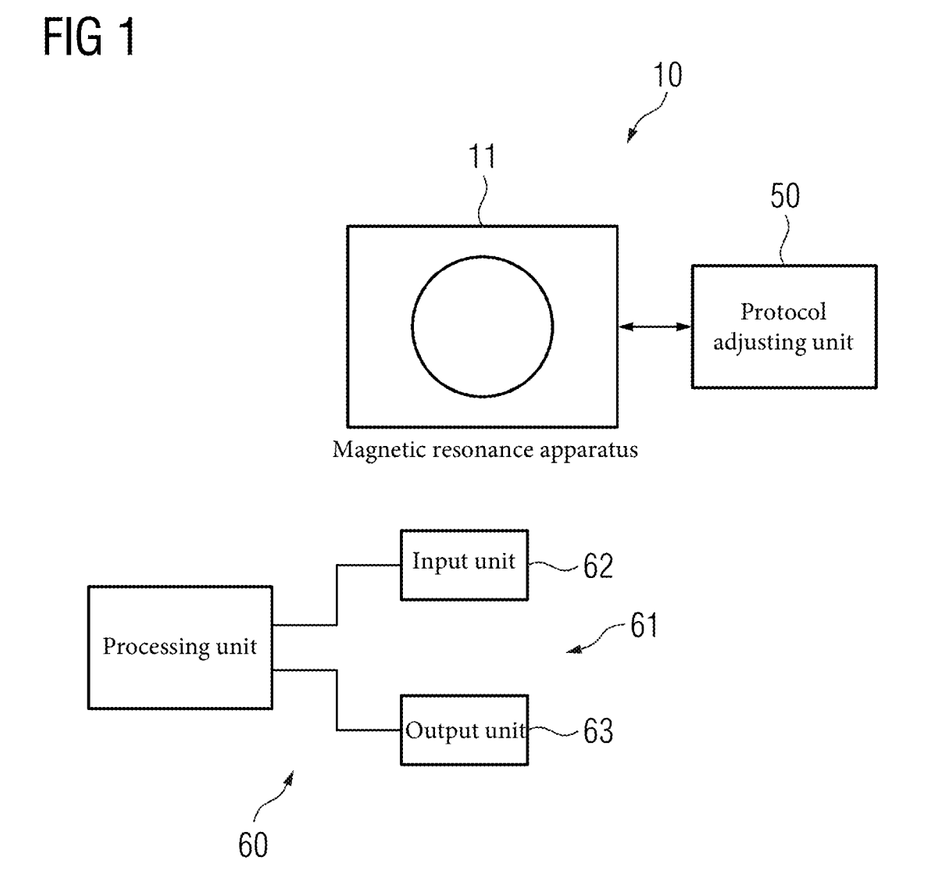
FIG. 1 illustrates an example magnetic resonance system according to one or more embodiments of the disclosure with a magnetic resonance apparatus, a selection unit, and a protocol adjusting unit.

FIG. 1 is a schematic depiction of an example magnetic resonance system 10 with a magnetic resonance apparatus 11, a protocol adjusting unit 50, and a selection unit 60. In this context, the protocol adjusting unit 50 is connected to the magnetic resonance apparatus 11 with regard to data exchange. On the other hand, the selection unit 60 is separate from the magnetic resonance apparatus 11 with regard to data exchange.

Figure 2:
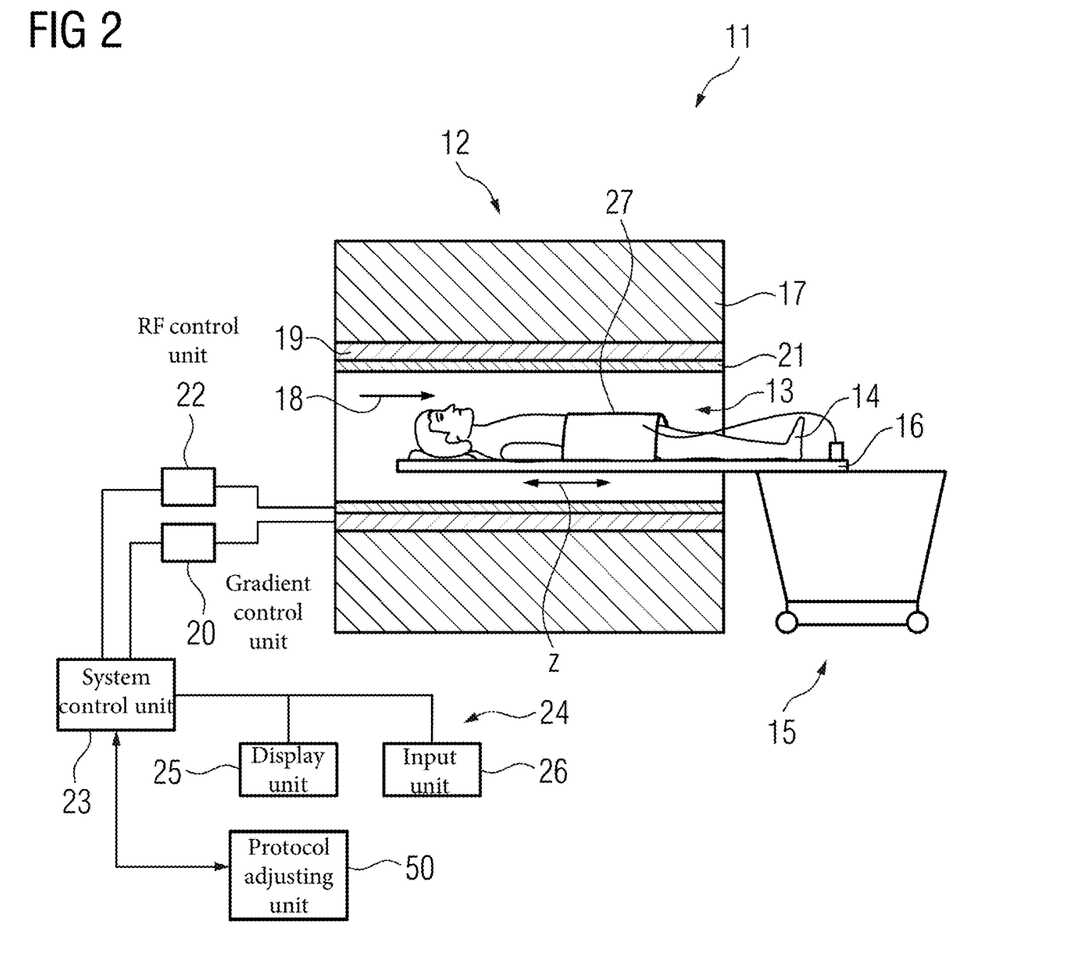
FIG. 2 illustrates an example magnetic resonance apparatus in a schematic depiction, according to one or more embodiments of the disclosure.

The magnetic resonance system 10 comprises the selection unit 60 and the protocol adjusting unit 50 for carrying out the method. In this context, the selection unit 60 is implemented separately from the scanner unit 12 (as shown in FIG. 2 and discussed below) and/or the magnetic resonance apparatus 11. For example, the selection unit 60 may be implemented separate from the scanner unit 12 and/or the magnetic resonance apparatus 11 with regard to data exchange. Moreover, the selection unit 60 has a user interface 61 with an input unit 62, such as, for example, a keyboard and an output unit 63, such as, for example, a monitor and/or a display, as can be seen in FIG. 1. The selection unit 60 may further include a processing unit that is coupled to the input unit 62 and the output unit 63. The processing unit may be implemented as any suitable number and/or type of processors, processor circuitry, executable software, and or hardware configured to implement the embodiments as discussed herein with respect to the selection unit 60.

On the other hand, the protocol adjusting unit 50 is connected to the scanner unit 12 and/or the magnetic resonance apparatus 11. As an example, the protocol adjusting unit 50 is connected to the scanner unit 12 and/or the magnetic resonance apparatus 11 with regard to data exchange. In the present exemplary embodiment, the protocol adjusting unit 50 is implemented separate from the magnetic resonance apparatus 11, but connected to the system control unit 23 for the purpose of data exchange with the scanner unit 12 (FIGS. 1 and 2). Alternatively, the protocol adjusting unit 50 can also be comprised by the magnetic resonance apparatus 11. For example, herein, the protocol adjusting unit 50 could be integrated in the system control unit 23 of the magnetic resonance apparatus 11.

The magnetic resonance apparatus 11 is depicted schematically in FIG. 2. The magnetic resonance apparatus 11 comprises a scanner unit 12 formed by a magnet unit. Moreover, the magnetic resonance apparatus 11 has a patient receiving area 13 for receiving a patient 14. In the present exemplary embodiment, the patient receiving area 13 is implemented as cylindrical and surrounded by the scanner unit 12, e.g. the magnet unit, in a cylindrical shape in a circumferential direction. In principle, however, a different implementation of the patient receiving area 13 is conceivable. The patient 14 can be pushed and/or moved into the patient receiving area 13 by means of a patient support apparatus 15 of the magnetic resonance apparatus 11. For this purpose, the patient support apparatus 15 has a patient table 16 that can be moved within the patient receiving area 13. In this context, the patient table 16 is e.g. mounted movably in the direction of a longitudinal extension of the patient receiving area 13 and/or in the z-direction.

The scanner unit 12, e.g. the magnet unit, comprises a superconducting main magnet 17 for generating a strong and constant main magnetic field 18. Furthermore, the scanner unit 12, e.g. the magnet unit, has a gradient coil unit 19 for generating magnetic field gradients that are used for spatial encoding during imaging. The gradient coil unit 19 is controlled by means of a gradient control unit 20 of the magnetic resonance apparatus 11. The scanner unit 11, e.g. the magnet unit, further comprises a radio-frequency antenna unit 21 for exciting a polarization which becomes established in the main magnetic field 18 generated by the main magnet 17. The radio-frequency antenna unit 21 is controlled by a radio-frequency antenna control unit 22 of the magnetic resonance apparatus 11 and radiates radio-frequency magnetic resonance sequences into the patient receiving area 13 of the magnetic resonance apparatus 11.

For acquiring magnetic resonance signals, the magnetic resonance apparatus 11 has a local radio-frequency coil 27 or also a plurality of local radio-frequency coils 27 positioned around the region of interest of the patient 14 for the magnetic resonance examination. In the present exemplary embodiment, one single local radio-frequency coil 27 is positioned on the patient 14. The local radio-frequency coil 27 is connected to the scanner unit 12 by a plug-in contact with the patient support apparatus 15.

To control the main magnet 17, the gradient control unit 20, and to control the radio-frequency antenna control unit 22, the magnetic resonance apparatus 11 has a system control unit 23. The system control unit 23 centrally controls the magnetic resonance apparatus 11, such as, for example, the performance of a predetermined imaging gradient echo sequence. Moreover, the system control unit 23 comprises an evaluation unit (not shown in further detail) for evaluating medical image data acquired during the magnetic resonance examination.

In addition, the magnetic resonance apparatus 11 comprises a user interface 24 connected to the system control unit 23. Control information such as, for example, imaging parameters and reconstructed magnetic resonance images can be displayed on a display unit 25, for example on at least one monitor, of the user interface 24 for a medical operator. Furthermore, the user interface 24 has an input unit 26, by means of which information and/or parameters can be input by the medical operator during a measurement process.

The magnetic resonance apparatus 11 depicted can obviously comprise further components usually comprised by magnetic resonance apparatuses 11. Moreover, the general mode of operation of a magnetic resonance apparatus 11 is known to the person skilled in the art so that no more detailed description of the further components will be given.

Figure 3:
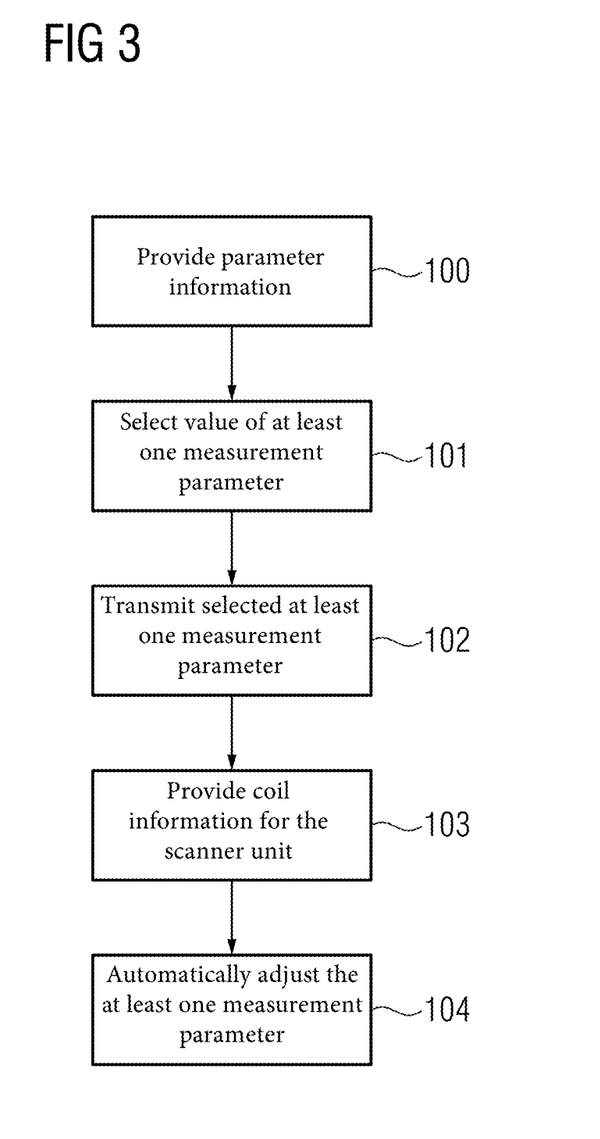
FIG. 3 illustrates an example method flow for adjusting at least one measurement parameter for a measurement protocol for a magnetic resonance examination, according to one or more embodiments of the disclosure.

FIG. 3 depicts a method according to the disclosure for adjusting at least one measurement parameter for a measurement protocol for a magnetic resonance examination. For instance, for a magnetic resonance examination on a patient 14, the medical operator defines a schedule and/or workflow wherein the schedule and/or workflow comprises at least one measurement protocol or also a plurality of measurement protocols. The measurement protocols each comprise a plurality of measurement parameters with partly adjustable values. The values of the measurement parameters are adjusted by the user, e.g. the medical operator, wherein the values of the adjustable measurement parameters are adapted to the patient 14 and/or to the respective magnetic resonance examination and/or to the hardware, e.g. to the magnetic resonance apparatus 11.

In a first method step 100 of the method according to the disclosure, at least one item of parameter information is provided for adjusting a value of at least one measurement parameter, wherein the at least one item of parameter information is provided independently of coil information for the magnetic resonance examination. This first method step 100 is performed by the selection unit 60, wherein the selection unit 60 is implemented separate from the scanner unit 12 and/or the magnetic resonance apparatus 11 with regard to data exchange, so that no coil information can be provided for carrying out the first method step 100.

The parameter information of the at least one measurement parameter can, for example, comprise a value range and/or a value space, e.g. a permissible value range and/or a permissible value space for the at least one measurement parameter. The parameter information for the at least one measurement parameter, e.g. the value range and/or the value space for the at least one measurement parameter, can, for example, be depicted by displaying the value range and/or the value space on a bar. In this context, the provision of the at least one item of parameter information also comprises the depiction of the at least one item of parameter information at the output unit 63 of the selection unit 60.

In a subsequent second method step 101, a value of the at least one measurement parameter is selected. The value of the at least one measurement parameter is selected by a user by means of the selection unit 60. In this context, the user selects the value of the at least one measurement parameter by means of the user interface 61 of the selection unit 60. The selection unit 60 may also have a memory unit, not shown in further detail, for storing the selected values of the measurement parameters of the individual measurement protocols.

The first method step 100 and the second method step 101 can be performed separately from the magnetic resonance examination in terms of time and space. For instance, the first method step 100 and the second method step 101 can be performed separately from the magnetic resonance apparatus 11 during the planning of the magnetic resonance examination.

To carry out the first method step 100 and the second method step 101, the selection unit 60 has corresponding software and/or computer programs. This software and/or these computer programs are stored in a memory unit of the selection unit 60 and executed by a processor of the selection unit 60 (e.g. the processing unit as shown in FIG. 1) to execute the first method step 100 and the second method step 101.

In a subsequent third method step 102, the selected value of the at least one measurement parameter is transmitted from the selection unit 60 to the protocol adjusting unit 50, which is connected to the scanner unit 12 with regard to data exchange. As an example, in this third method step 102 all selected values of measurement parameters for the upcoming magnetic resonance examination may be transmitted from the selection unit 60 to the protocol adjusting unit 50.

In a further fourth method step 103 following the third method step 102, coil information of the scanner unit 12 is provided. The coil information is provided by means of the parameter adjusting unit 50. The coil information provided comprises, for example, a number of radio-frequency coils 27, which are connected to the scanner unit 12, and/or a type of local radio-frequency coil 27, which is connected to the scanner unit 12 for the upcoming magnetic resonance examination. The coil information can, for example, be acquired on the basis of plug-in contacts between the local radio-frequency coils 27 and the scanner unit 12. The coil information provided can moreover also comprise information as to which value range and/or which value space is available for the value of the at least one measurement parameter when using a defined and/or specific local radio-frequency coil 27. A coil-related value range and/or coil-related value space for the value of the at least one measurement parameter when using a defined and/or specific local radio-frequency coil 27 and/or coil configuration can also be allocated by the protocol adjusting unit 50 if information on the type and scope of the local radio-frequency coil 27 and/or coil configuration is available.

Subsequently, in a fifth method step 104, the value of the at least one measurement parameter is automatically adjusted in dependence on the coil information provided by means of the parameter adjusting unit 50. Adjustment of the value of the at least one measurement parameter also comprises a comparison and/or check of the selected value of the at least one measurement parameter with the coil information provided. In this context, the protocol adjusting unit 50 can determine whether or not there is conformity between the selected value of the at least one measurement parameter and the coil information provided. Conformity is present when the selected value of the at least one measurement parameter is within a permissible value range for the local radio-frequency coil 27 and/or value space for the at least one measurement parameter. If the coil information is in conformity with the selected value of the at least one measurement parameter, the protocol adjusting unit 50 automatically directly adjusts the value of the at least one measurement parameter selected in the second method step 101.

On the other hand, if there is no conformity between the selected value of the at least one measurement parameter and the coil information provided, i.e. if the coil information provided is allocated a permissible value range and/or a permissible value space for the at least one measurement parameter, wherein the permissible value range and/or the permissible value space does not comprise the selected value of the at least one measurement parameter, the protocol adjusting unit 50 automatically determines an adapted value of the selected value of the at least one measurement parameter in dependence on the coil information provided. In such a case, the protocol adjusting unit 50 automatically adjusts the selected value of the at least one measurement parameter until the value of the at least one measurement parameter is in conformity with the permissible value range allocated to the coil information provided and/or the permissible value space for the at least one measurement parameter. Subsequently, the protocol adjusting unit 50 adjusts the adapted value of the at least one measurement parameter.

The fifth method step 104 of the automatic adjustment of the value of the at least one measurement parameter in dependence on the coil information provided can also comprise that output information being automatically generated by the protocol adjusting unit 50 on an adaptation of the value of the at least one measurement parameter. Such output information is output to the user by the user interface 24 of the magnetic resonance apparatus 10. Moreover, it is also conceivable for the protocol adjusting unit 50 to comprise a separate user interface for outputting the output information to the user.

The output information is generated by the protocol adjusting unit 50 after the adaptation of the value of the at least one measurement parameter and before the magnetic resonance examination is carried out on the patient 14. The output information may be e.g. output to the user before the magnetic resonance examination is carried out by means of the adapted value of the at least one measurement parameter.

For example, the coil information provided can comprise information on a radio-frequency coil A and a radio-frequency coil B. Continuing this example, for the radio-frequency coil A, a permissible value range for a measurement parameter P is between 0 and 10. For the radio-frequency coil B, a permissible value range for the measurement parameter P is between 5 and 15. If the user adjusts the measurement parameter P to a value of P=8 selected in the second method step 101, then the measurement protocol can be used with both radio-frequency coil A and radio-frequency coil B for this selected value of the measurement parameter P. If, on the other hand, the value of the measurement parameter selected in the second method step 101 is P=11, the measurement protocol could only be carried out with radio-frequency coil B.

If, on the other hand, only coil information for radio-frequency coil A is available, wherein a permissible value range for the measurement parameter P is between 0 and 10 for the radio-frequency coil A, and the value of the measurement parameter selected in the second method step is P=11, the measurement protocol could only be carried out with radio-frequency coil A if the value of the measurement parameter P is changed to 10. This change is then output to the user by the protocol adjusting unit 15 and the user interface 24 connected to the protocol adjusting unit 50.

In addition, in this fifth method step 104 of the automatic adjustment of the value of the at least one measurement parameter, it can also be provided that the protocol adjusting unit 50 automatically selects a local radio-frequency coil 27 on the basis of the selected value of the at least one measurement parameter in dependence on the coil information provided. If, for example, the coil information provided comprises that two or more local radio-frequency coils and/or coil configurations 27 are available for the upcoming magnetic resonance examination, the protocol adjusting unit 50 can select a best coil configuration in dependence on the selected value of the at least one measurement parameter. Moreover, it can also be the case that the protocol adjusting unit 50 automatically selects the corresponding coil elements of a local radio-frequency coil 27 in dependence on the selected value of the at least one measurement protocol. For example, in the case of a local radio-frequency coil comprising a 32-channel radio-frequency spine coil with eight selectable coil elements, the protocol adjusting unit 50 can automatically select the corresponding coil elements and thus the best coil configuration of the 32-channel radio-frequency spine coil.

To carry out the fourth method step 103 and the fifth method step 104, the protocol adjusting unit 50 has corresponding software and/or computer programs. This software and/or these computer programs are stored in a memory unit of the protocol adjusting unit 50 and are executed by a processor (e.g. processing circuitry) of the protocol adjusting unit 50 to carry out the fourth method step 103 and the fifth method step 104.

For the adjustment of the value of the at least one measurement parameter in dependence on the coil information provided, e.g. for the determination of an adapted value of the selected value of the at least one measurement parameter in dependence on the coil information provided, the protocol adjusting unit 50 may implement any suitable type of artificial intelligence with an artificial neural network. The artificial neural network may be specially trained to adjust the value of the at least one measurement parameter automatically in dependence on the coil information provided. As an example, the artificial neural network may be specially trained to determine an adapted value of the selected value of the at least one measurement parameter automatically and to adjust the adapted value automatically.

After the adjustment of the value of the at least one measurement parameter or the values of the measurement parameters in dependence on the coil information provided, the magnetic resonance examination is carried out on the patient.

In the present exemplary embodiment, the selection unit 60 and the protocol adjusting unit 50 are implemented as two units that are separate from one another. In an alternative embodiment of the selection unit 60 and/or the protocol adjusting unit 50, these two units can be implemented as a common unit, wherein the common unit is separate from the scanner unit 12 for carrying out the first two method steps 100, 101.

Although the disclosure was illustrated and described in greater detail by the preferred exemplary embodiments, the disclosure is not restricted by the disclosed examples and other variations can be derived by a person skilled in the art without departing from the scope of protection of the disclosure.

The various components described herein may be referred to as "units" or "modules" by for ease of explanation. Unless otherwise specified, such components (e.g. the protocol adjusting unit 50 and/or the selection unit 60 as well as components thereof) may be implemented as any suitable type of processor, processing circuitry, hardware, executable software (e.g. from stored instructions), etc., or combinations thereof, as further discussed herein with respect to their corresponding functionalities. Thus, any such components may be alternatively be referred to herein as a processor or processor circuitry, although it is acknowledged that such components may not be implemented exclusively via hardware in some embodiments.

What is claimed is:

1. A method for adjusting a measurement parameter for a measurement protocol used to perform a magnetic resonance examination using a magnetic resonance apparatus, comprising:

providing, via selection processing circuitry that is separate from a scanner of the magnetic resonance apparatus, parameter information for adjusting a value of the measurement parameter,
wherein the measurement parameter is from among a set of measurement parameters used as part of radio-frequency magnetic resonance sequence, the set of measurement parameters defining a manner in which a magnetic resonance sequence is to be performed, the measurement parameter having a range of possible values based upon a respective magnetic resonance sequence in which the measurement parameter is used, and
wherein the parameter information is provided independently of coil information associated with the scanner that is used for the magnetic resonance examination,
selecting, via the selection processing circuitry, a value of the measurement parameter;
transmitting, via the selection processing circuitry, the selected value of the measurement parameter to protocol adjusting circuitry that is coupled to the scanner of the magnetic resonance apparatus;
providing, via the protocol adjusting circuitry, the coil information associated with the scanner; and
automatically adjusting, via the protocol adjusting circuitry, the value of the measurement parameter based upon the provided coil information.

2. A magnetic resonance system, comprising:
a magnetic resonance apparatus comprising a scanner for acquiring magnetic resonance image data in accordance with a magnetic resonance examination;
selection processing circuitry that is separate from the scanner of the magnetic resonance apparatus, the selection processing circuitry configured to:
provide parameter information for adjusting a value of a measurement parameter, wherein the measurement parameter is from among a set of measurement parameters used as part of radio-frequency magnetic resonance sequence, the set of measurement parameters defining a manner in which a magnetic resonance sequence is to be performed, the measurement parameter having a range of possible values based upon a respective magnetic resonance sequence in which the measurement parameter is used, and
wherein the parameter information is provided independently of coil information associated with the scanner that is used for the magnetic resonance examination;
select a value of the measurement parameter; and
transmit the selected value of the measurement parameter; and
protocol adjusting circuitry, coupled to the scanner of the magnetic resonance apparatus, configured to:
receive the transmitted selected value of the measurement parameter protocol;
provide the coil information associated with the scanner; and
automatically adjust the value of the measurement parameter based upon the provided coil information.

3. The method as claimed in claim 1, wherein the act of automatically adjusting the value of the measurement comprises:
adjusting the selected value of the measurement parameter when the selected value of the measurement parameter is in conformity with the provided coil information.

4. The method as claimed in claim 1, wherein the act of automatically adjusting the value of the measurement parameter comprises:
  determining an adapted value of the measurement parameter based upon the provided coil information when the selected value of the measurement parameter is not in conformity with the provided coil information.

5. The method as claimed in claim 4, further comprising: generating output information to a user interface indicative of the adapted value of the measurement parameter.

6. The method as claimed in claim 1, wherein the act of automatically adjusting the value of the measurement parameter comprises:
  automatically adjusting the value of the measurement parameter using artificial intelligence.

7. The method as claimed in claim 1, further comprising:
  automatically selecting, via the protocol adjusting circuitry, a local radio-frequency coil based upon the selected value of the measurement parameter.

8. The magnetic resonance system as claimed in claim 2, wherein the protocol adjusting circuitry is configured to automatically adjust the value of the measurement when the selected value of the measurement parameter is in conformity with the provided coil information.

9. The magnetic resonance system as claimed in claim 2, wherein the protocol adjusting circuitry is configured to automatically adjust the value of the measurement by determining an adapted value of the measurement parameter based upon the provided coil information when the selected value of the measurement parameter is not in conformity with the provided coil information.

10. The magnetic resonance system as claimed in claim 9, wherein the protocol adjusting circuitry is configured to generate output information to a user interface indicative of the adapted value of the measurement parameter.

11. The magnetic resonance system as claimed in claim 2, wherein the protocol adjusting circuitry comprises an artificial neural network (ANN), and
  wherein the protocol adjusting circuitry is configured to automatically adjust the value of the measurement using the ANN.

12. The magnetic resonance system as claimed in claim 2, wherein the protocol adjusting circuitry is configured to automatically select a local radio-frequency coil based upon the selected value of the measurement parameter.

13. The method as claimed in claim 1, wherein the parameter information comprises a permissible value range for the value of the measurement parameter, and
  wherein the act of automatically adjusting the value of the measurement comprises:
  adjusting the selected value of the measurement parameter to be within the permissible value range based upon the provided coil information.

14. The method as claimed in claim 3, wherein the measurement parameter is in conformity with the provided coil information when the selected value of the measurement parameter is within a permissible value range in accordance with a local coil, and
  wherein local coil is identified via the provided coil information.

15. The method of claim 1, wherein the measurement parameter specifies an echo time (TE), a repetition time (TR), a field of view, a matrix size, a number of slices, a fat saturation method, an acceleration method, or a local antenna.

16. The method of claim 1, wherein the coil information cannot be accessed via the selection processing circuitry.

17. The method of claim 1, wherein the act of providing the coil information comprises providing the coil information only when a data connection is present between the protocol adjusting circuitry and the scanner of the magnetic resonance apparatus.

\* \* \* \* \*